United States Patent
Rofougaran et al.

(10) Patent No.: US 7,509,102 B2
(45) Date of Patent: Mar. 24, 2009

(54) DAC BASED SWITCHING POWER AMPLIFIER

(75) Inventors: Ahmadreza (Reza) Rofougaran, Newport Coast, CA (US); Amin Shameli, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 508 days.

(21) Appl. No.: 11/439,023

(22) Filed: May 23, 2006

(65) Prior Publication Data
US 2007/0275676 A1    Nov. 29, 2007

Related U.S. Application Data

(60) Provisional application No. 60/790,515, filed on Apr. 7, 2006.

(51) Int. Cl.
*H04B 1/04* (2006.01)
(52) U.S. Cl. ........................ 455/127.1; 330/10
(58) Field of Classification Search .................. 455/91, 455/116, 126, 127.1, 127.2, 127.4; 375/295, 375/296; 330/10, 124 R, 129, 149
See application file for complete search history.

(56) References Cited

U.S. PATENT DOCUMENTS

| | | | |
|---|---|---|---|
| 2005/0190854 A1* | 9/2005 | Shakeshaft et al. | 375/295 |
| 2006/0160499 A1* | 7/2006 | Puma | 455/116 |
| 2007/0026823 A1* | 2/2007 | Eisenhut et al. | 455/127.1 |
| 2007/0247222 A1* | 10/2007 | Sorrells et al. | 330/10 |

* cited by examiner

*Primary Examiner*—Thanh C Le
(74) *Attorney, Agent, or Firm*—Garlick Harrison & Markison; Holly L. Rudnick

(57) ABSTRACT

A power amplifier for use in a transmitter includes a first transistor having an input, a first node and a second node, a second transistor having an input, a first node and a second node and a digital to analog conversion module. The input of the first transistor is operably coupled to receive a first input, while the input of the second transistor is operably coupled to receive a second input. The second nodes of the first and second transistors provide an output of the power amplifier. The digital to analog conversion module is operably coupled to control current through the first and second transistors based on at least one of a power control signal and an amplitude modulation control signal.

21 Claims, 15 Drawing Sheets

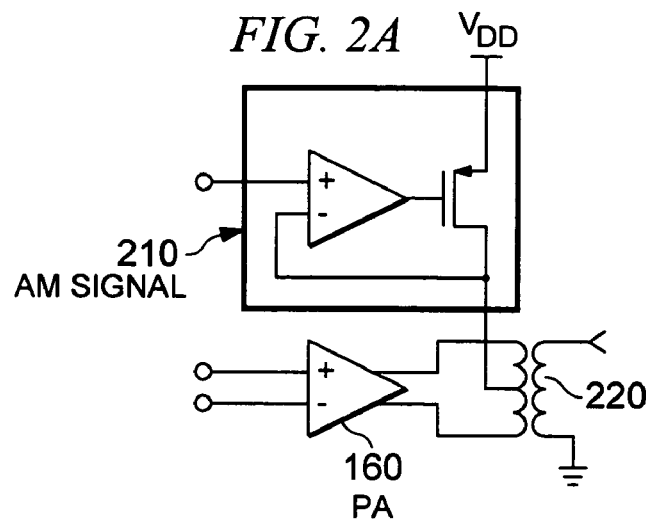
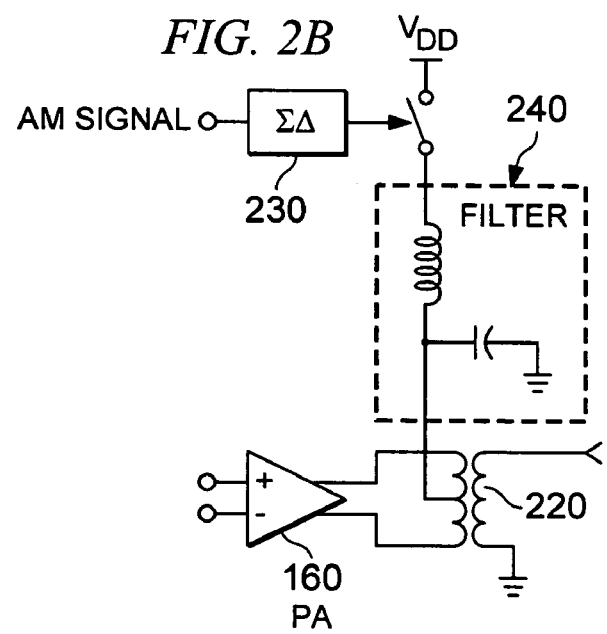

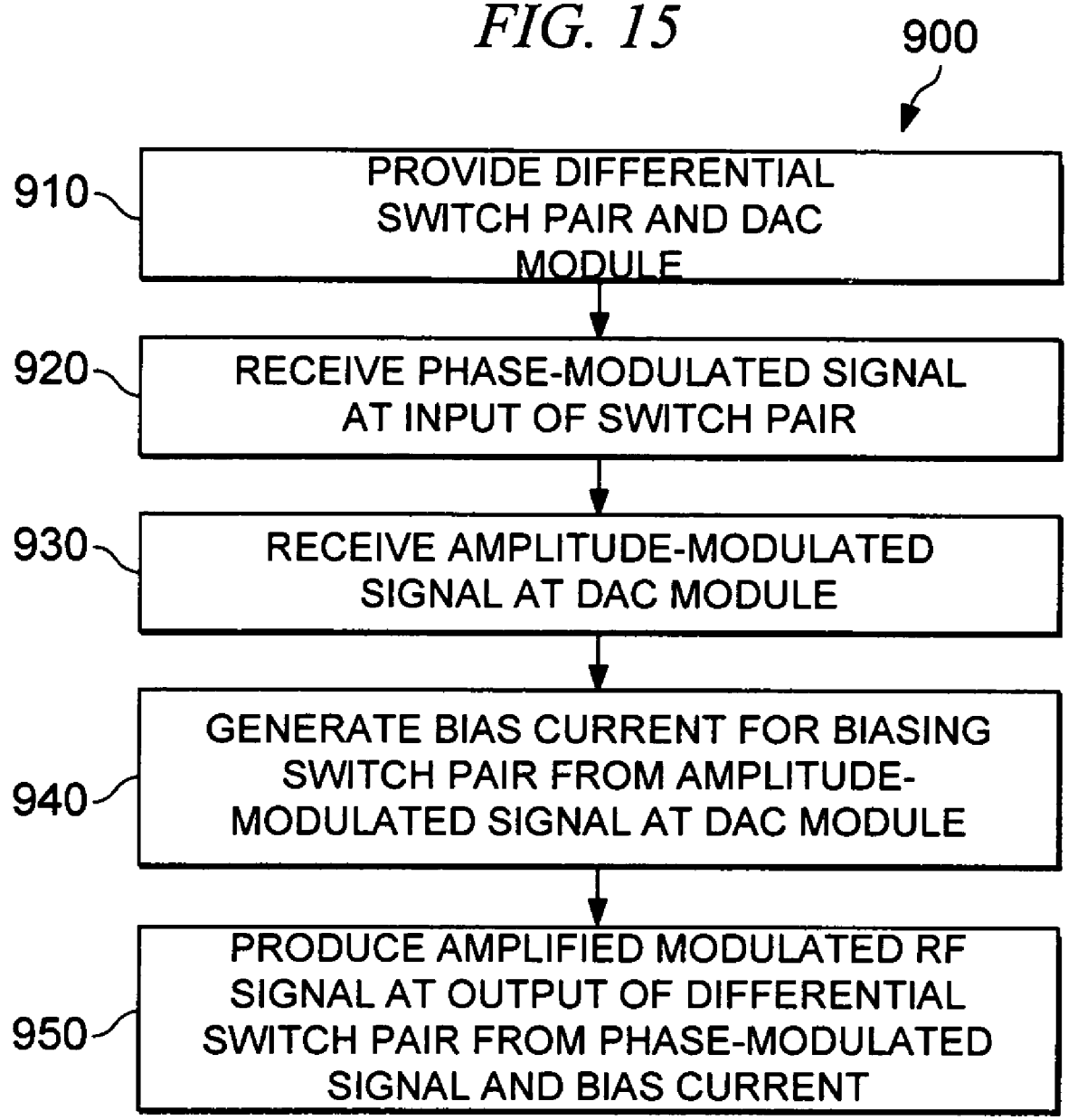

DAC BASED SWITCHING POWER AMPLIFIER

CROSS REFERENCE TO RELATED PATENTS

This U.S. application for patent claims the benefit of the filing date of U.S. Provisional Patent Application entitled, DAC BASED SWITCHING POWER AMPLIFIER, having Ser. No. 60/790,515, filed on Apr. 7, 2006, which is incorporated herein by reference for all purposes.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

BACKGROUND OF THE INVENTION

1. Technical Field of the Invention

The present invention relates to communication systems and, more particularly, to power amplifiers used within transmitters.

2. Description of Related Art

Modern wireless RF transmitters for applications, such as cellular, personal, and satellite communications, employ digital modulation schemes, such as frequency shift keying (FSK), phase shift keying (PSK), and variants thereof, often in combination with code division multiple access (CDMA) communication. Independent of the particular communications scheme employed, the RF transmitter output signal, $s_{RF}(t)$, can be represented mathematically as $$s_{RF}(t)=r(t)\cos(2\pi f_c t+\theta(t)) \quad (1)$$

where $f_c$ denotes the RF carrier frequency, and the signal components $r(t)$ and $\theta(t)$ are referred to as the envelope (amplitude) and phase of $s_{RF}(t)$, respectively.

Some of the above mentioned communication schemes have constant envelope, i,e., $$r(t)=R,$$

and these are thus referred to as constant-envelope communications schemes. In these communications schemes, $\theta(t)$ constitutes all of the information bearing part of the transmitted signal. Other communications schemes have envelopes that vary with time and these are thus referred to as variable-envelope communications schemes. In these communications schemes, both $r(t)$ and $\theta(t)$ constitute information bearing parts of the transmitted signal.

A transmitter appropriate for a variable-envelope modulation scheme is a polar transmitter. In a polar transmitter, digital baseband data enters a digital processor that performs the necessary pulse shaping and modulation to some intermediate frequency (IF) carrier $f_{IF}$ to generate digital envelope (amplitude-modulated) and digital phase-modulated signals. The digital amplitude-modulated signal is input to a digital-to-analog converter (DAC), followed by a low pass filter (LPF), along an amplitude path, and the digital phase-modulated signal is input to another DAC, followed by another LPF, along a phase path. The output of the LPF on the amplitude path is an analog amplitude signal, while the output of the LPF on the phase path is an analog reference signal. The analog reference signal is input to a phase locked loop to enable the phase of the RF output signal to track the phase of the analog reference signal. The RF output signal is modulated in a non-linear power amplifier (PA) by the analog amplitude-modulated signal.

Thus, in polar transmitter architectures, the phase component of the RF signal is amplified through the non-linear PA while the amplitude modulation is performed at the output of the PA. This architecture, however, requires phase and amplitude alignment to make sure that the amplitude modulated and phase modulated data are applied at the right instant.

In addition, polar transmitters also have several challenges related to amplitude modulation and power control. Conventional amplitude modulation techniques are typically based on the modulation of the power supply. However, the amplitude component of the RF signal occupies several times more bandwidth than the combination of the phase and amplitude data. Therefore, conventional power supply modulation techniques are limited for many wideband applications. In addition, in many wireless systems, the output power must be controlled in order to keep the received signal from reaching all users at the same power level. However, in switching power amplifiers, the power control is performed using the same method as that used for amplitude modulation. As a result, in switching power amplifiers, there is a trade off between the power control dynamic range and the resolution of the amplitude modulation.

Therefore, a need exists for a switching power amplifier that provides high bandwidth, high resolution amplitude modulation capability as well as high power control dynamic range.

BRIEF SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWING(S)

FIGS. 2A and 2B are schematic block diagrams illustrating conventional amplitude modulation techniques in polar transmitters;

FIG. 15 is a logic diagram of a method for producing an amplified modulated RF signal, in accordance with embodiments of the present invention.

DETAILED DESCRIPTION OF THE INVENTION

Figure 1:
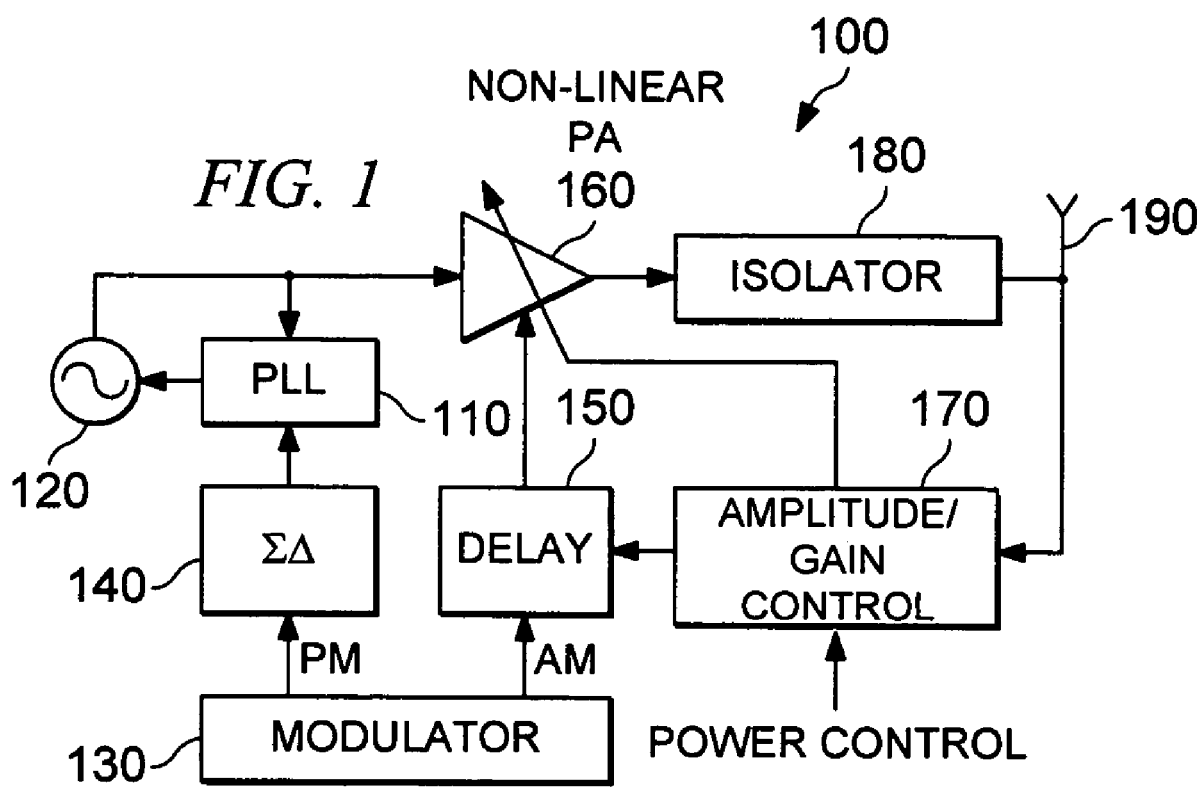
FIG. 1 is a schematic block diagram illustrating a conventional polar transmitter.

FIG. 1 is a schematic block diagram illustrating a conventional polar transmitter 100. In FIG. 1, it is assumed that a baseband processor delivers baseband envelope signal r(t) and baseband phase signal θ(t) to the polar transmitter for further processing and RF transmission. The polar transmitter 100 includes a modulator 130 that performs the necessary pulse shaping, modulation, and interpolation filtering to produce a digital phase-modulated signal and a digital amplitude-modulated signal, each at some intermediate frequency (IF) carrier $f_{IF}$. Additional spectral shaping may be performed on the phase-modulated signal by using a delta-sigma modulator 140. Although not shown, the polar transmitter 100 further includes digital-to-analog converters (DACs) that convert the IF phase-modulated signal and IF amplitude-modulated signal from digital to analog.

The remaining components of the polar transmitter 100 are a phase-locked loop (PLL) 110, a local oscillator (LO) 120, a delay 150, a non-linear switching power amplifier (PA) 160, an amplitude/gain control 170, an isolator 180 and an antenna 190. The IF analog phase-modulated signal is input to the PLL 110, which translates, or up-converts, the IF signal to the desired RF signal via the LO 120. With proper PLL 110 design, the phase of the RF output signal tracks the phase of the IF signal, as desired. The RF output signal is modulated in the PA 160 by the analog amplitude-modulated signal output from delay 150. The delay 150 is controlled by the amplitude/gain control 170 to ensure that the amplitude-modulated data and phase-modulated data are synchronized. Thus, the phase component of the RF signal is amplified through the non-linear PA 160, while the amplitude modulation is performed at the output of the PA 160. The modulated RF signal output from the PA 160 is transmitted over the antenna 190 via isolator 180.

Polar transmitters 100, such as the transmitter illustrated in FIG. 1, enable the use of high-power, highly efficient non-linear power amplifiers 160. However, as mentioned above, polar transmitters 100 also require phase and amplitude alignment to ensure that the amplitude-modulated data and phase-modulated data are applied to the PA 160 at the proper time. To achieve the proper timing simply and with high power efficiency, conventional amplitude modulation techniques are primarily based on the modulation of the power supply.

FIGS. 2A and 2B are schematic block diagrams illustrating conventional amplitude modulation techniques in polar transmitters. FIG. 2A illustrates a voltage regulator technique, in which a voltage regulator 210 is used to modulate the power supply $V_{DD}$ input to the center tab of a balun 220 operably coupled to the output of the PA 160 in order to modulate the amplified RF signal. However, voltage regulators 210 suffer from inherent low efficiency and non-linearity. Another technique, known as the supply chopping technique, is shown in FIG. 2B. The signal input to the center tab of the balun 220 switches between the supply voltage $V_{DD}$ and an amplitude-modulated signal provided by a delta-sigma modulator 230 to modulate the output of the PA 160. However, the supply chopping technique shown in FIG. 2B requires a large LC filter 240 that introduces a large delay and has very limited bandwidth.

In addition, since the amplitude component of the RF signal occupies several times more bandwidth than the combination of phase and amplitude data, supply modulation techniques, such as those shown in FIGS. 2A and 2B, are limited for many wideband applications. Furthermore, many wireless systems require the transmitter to control the output power in order to keep the received signal from reaching all users at the same power level. However, in the switching power amplifiers 160 shown in FIGS. 2A and 2B, the power control is performed using the same technique (i.e., voltage regulation or supply chopping) as that used for amplitude modulation. As a result, in such switching power amplifiers 160, there is a trade off between power control dynamic range and the resolution of the amplitude modulation.

Figure 3A:
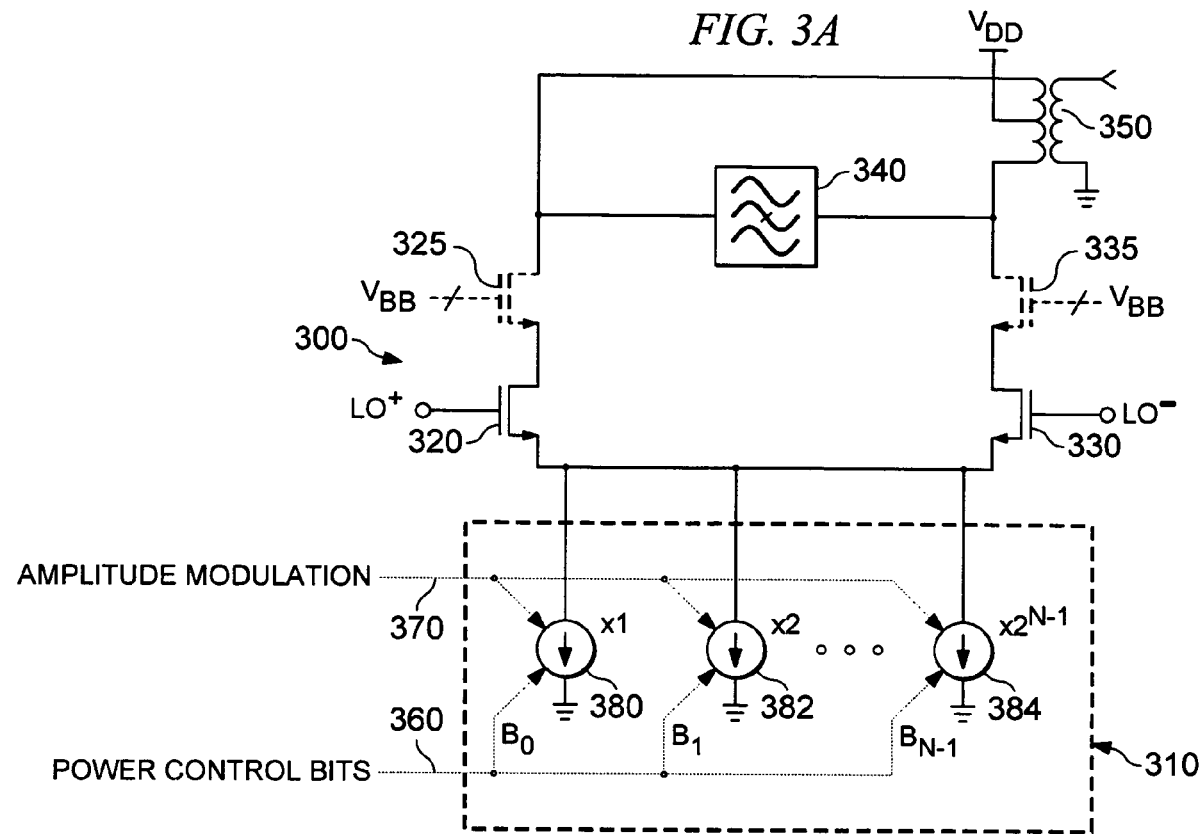
FIG. 3A is a schematic block diagram illustrating an exemplary digital-to-analog (DAC) based switching power amplifier, in accordance with embodiments of the present invention.
Figure 3B:
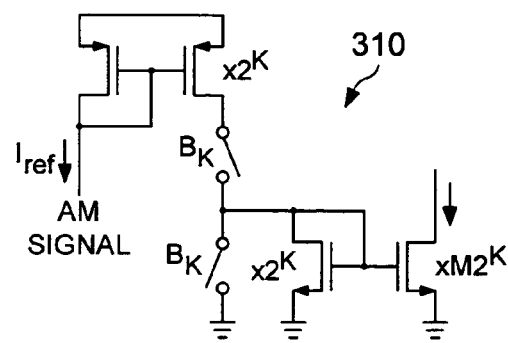
FIG. 3B is a circuit diagram illustrating an exemplary digital-to-analog conversion module for use in the DAC based switching power amplifier of FIG. 3A.

Referring now to FIGS. 3A and 3B, there is illustrated a switching power amplifier 300 that provides high-bandwidth, high-resolution amplitude modulation capability as well as high power control dynamic range, in accordance with embodiments of the present invention. Instead of modulating the output of the PA, as shown in FIGS. 2A and 2B, in FIGS. 3A and 3B, the modulation is performed within the switching power amplifier 300. The modulation is based on the concept of a digital-to-analog converter (DAC). The DAC based switching power amplifier 300 shown in FIG. 3A includes a digital-to-analog conversion (DAC) module 310 and differential switching transistors 320 and 330. The DAC module 310 is operably coupled to receive an amplitude modulation control signal 370 (e.g., an analog amplitude-modulated signal 370 generated, for example, by a modulator similar to the modulator 130 shown in FIG. 1). In addition, the DAC module 310 is further operably coupled to receive a power control signal 360 (e.g., power control bits 360) for controlling the output power of the PA 300.

Each of the switching transistors 320 and 330 includes an input (e.g., a gate), a first node (e.g., a source node) and a second node (e.g., a drain node). The input of switching transistor 320 is operably coupled to receive a first input, while the input of switching transistor 330 is operably coupled to receive a second input. In an exemplary embodiment, the inputs to switching transistors 320 and 330 are operably coupled to receive respective outputs of a local frequency generator (LO+ and LO−). In one embodiment, the LO signals, LO+ and LO−, are RF phase-modulated signals generated, for example, by the modulator 130 shown in FIG. 1 and up-converted by the PLL 110/LO 120 shown in FIG. 1.

The DAC module 310 is operably coupled to the source nodes of switching transistors 320 and 330, while the drain nodes of switching transistors 320 and 330 provide an output of the power amplifier 300. More particularly, the drain nodes of switching transistors 320 and 330 are operably coupled to an inductive load 350 at the output of the power amplifier 300. In an exemplary embodiment, the inductive load 350 is a balun. In addition, a filter 340 is operably coupled between the drain nodes of switching transistors 320 and 330 and is operably coupled between the inductive load 350 and the drain nodes of switching transistors 320 and 330. Thus, switching transistors 320 and 330 together form a differential switch pair whose differential output is applied to the inductive load 350 via filter 340.

The DAC module 310 includes a plurality of current sources 380, 382, 384 operably coupled in parallel to generate a current proportional to the amplitude-modulated signal 370 and the power control bits 360. The current is then up-converted to the RF frequency by applying the RF phase-modulated signal to the inputs of switching transistors 320 and 330. Details of the DAC module 310 are shown in FIG. 3B. As can be seen in FIGS. 3A and 3B, the tail current source of switching transistors 320 and 330 is a binary weighted digital to analog converter module 310 generating a bias current for biasing the switching transistors 320 and 330 that can be expressed by:

$$I_{bias} = I_{ref}(B_0 \times 2^0 + B_1 \times 2^1 + \ldots + B_{N-1} \times 2^{N-1}), \quad \text{(Equation 1)}$$

where $I_{ref}$ is the amplitude-modulated signal 370 used as the DAC reference current, and BN−1 . . . B0 is the power control word 360 applied to the digital input of the DAC module 310. In embodiments in which the amplitude-modulated signal 370 is in digital format, the amplitude-modulated signal 370 may be applied to the digital input of the DAC module 310, and the reference current can be used to control the output power of the power amplifier 300.

In order to determine the current and voltage waveforms at the drain nodes of the switching transistors 320 and 330, it is assumed that the variations of the bias current $I_{bias}$ due to the amplitude modulation and power control is much slower than the voltage variation of the LO signal. By this assumption, the current waveform at each drain node can be approximated as a pulse with high and low values equal to zero and $I_{bias}$. The differential current produced at the drain nodes of switching transistors 320 and 330 is applied to the balun 350 and to the band stop filter 340. Due to its symmetrical waveform, this differential current contains only odd harmonics of the LO frequency. The band stop filter 340, however, is a short circuit at all odd harmonics and is an open circuit at the fundamental frequency of the LO. Therefore, the current passing to the balance port of the balun 350 is a sine wave with amplitude proportional to the amplitude-modulated signal 370 and the power control word 360.

To determine the drain voltage of the switching transistors 320 and 330, it is assumed that the differential voltage at the balance port of the balun 350 is a sinusoidal waveform since the input impedance seen from this port is resistive at the LO frequency. Moreover, at the time when the switching transistors 320 and 330 are "on", the drain nodes are connected to the common node of the differential switch pair 320 and 330. However, the common mode voltage is determined by the switching transistors 320 and 330 and contains only even harmonics of the LO. Based on the above discussion, the drain voltage of the switching transistors 320 and 330 in each period can be expressed as the following equation:

$$V_D(\theta) = \begin{cases} V_c(\theta) + V_a \sin(\theta) & 0 < \theta < \pi \\ V_c(\theta) & \pi < \theta < 2\pi, \end{cases} \quad \text{(Equation 2)}$$

where $\theta$ is the phase of the local oscillator, $V_D(\theta)$ is the voltage wave form of the common mode node and $V_a$ is the amplitude of the differential voltage at the drains of the switching transistors 320 and 330. The dc voltage at the drain nodes of the switching transistors 320 and 330 is equal to the supply voltage since the drain nodes are connected to $V_{DD}$ through the center tap of the balun 350. Therefore, the dc voltage at the switching transistors 320 and 330 is equal to the supply voltage $V_{DD}$. Using Equation 2 to calculate the average voltage at the drain nodes of switching transistors 320 and 330, the amplitude of the differential voltage at the output can be expressed as follows:

$$V_a = \frac{V_{DD} - \frac{1}{2\pi}\int_0^{2\pi} V_c(u)du}{\frac{1}{2\pi}\int_0^{\pi} \sin(u)du} = \pi(V_{DD} - V_B), \quad \text{(Equation 3)}$$

where $V_B$ is the average voltage at the common mode node.

The output power of the power amplifier 300 can be defined in terms of both voltage amplitude and the DAC current, as shown in the following equation:

$$P_{out} = \frac{1}{2}\left(a_{loss}\frac{2}{\pi}I_{Bias}\right)^2 R_L = \frac{V_a^2}{2R_L}, \quad \text{(Equation 4)}$$

where $a_{loss}$ is the loss of the filter 340, $R_L$ is the load 350 impedance, $I_{bias}$ is the current of the tail current source that expressed by Equation 1 above and $V_a$ is the amplitude of the output voltage. The $2/\pi$ term in Equation 4 is the coefficient of the fundamental component of the current waveform, which is a pulse train with minimum and maximum values of 0 to $I_{bis}$. Substituting Equation 1 into Equation 4, it becomes apparent that the amplitude of the output voltage is linearly proportional to the reference input of the DAC module 310, $I_{ref}$. Moreover, the output power is proportional to the square of the value indicated by the power control word 360 BN−1 . . . B0.

The output swing depends on the amount of current generated in the tail current source (DAC module 310). By increasing the bias current $I_{bias}$, the voltage swing at the output increases, which causes the voltage over the tail current source to decrease. However, the current source requires a minimum voltage to keep the transistors 320 and 330 in the saturation region. Using Equation 3 above, the maximum output power is expressed by Equation 4 as a function of the voltage supply, the minimum voltage over the current source, $V_{B,min}$, and the impedance seen from the balance input of the balun 350 as follows:

$$P_{out,\max} = \frac{[\pi(V_{DD} - V_{B,\min})]^2}{2R_L} \quad \text{(Equation 5)}$$

In Equation 5, it is assumed that the balun 350, switching transistors 320 and 330 and the filter 340 are free of loss. However, in normal operation there is some loss due to the balun 350, the filter 340 and the channel resistance of the switching transistors 320 and 330. Moreover, due to the large sizes of the switching transistors 320 and 330, there is a parasitic capacitor from each node to ground that introduces a low impedance path at the frequency of operation. As a result, the parasitic capacitors steal a portion of the current, which lowers the efficiency of the power amplifier 300. To prevent transistor break down, as well as reducing the effect of LO leakage through the $C_{GD}$ capacitors of the switching transistors 320 and 330, cascode transistors can be placed on top of the switching transistors 320 and 330. In addition, or in the alternative, the parasitic capacitors can be tuned out using an ac-coupled on-chip inductor placed between the two drain nodes of the switching transistors 320 and 330.

Amplitude-modulation (AM) to phase-modulation (PM) conversion is another problem related to LO feed-through in non-linear power amplifiers 300. The value of the $C_{GD}$ in MOSFET transistors is a function of the drain source voltage. Therefore, the amount of LO leakage changes with the amplitude level of the output signal. On the other hand, the leakage current is orthogonal to the drain current of the switching transistor due to the 90° phase difference of the capacitor's voltage and current. As a result, when the amplitude modulation is applied, there is a variation in the carrier's phase due to the leakage which is a function of the carrier's envelope (amplitude). This effect is known as the AM to PM conversion, and is critical when the power amplifier 300 operates at high output power level. To compensate for the AM to PM conversion in polar transmitters, a pre-distortion filter or phase feedback loop can be employed. In addition to or in the alternative to using a pre-distortion filter and/or phase feedback loop, as optionally shown in FIG. 3A, using cascode transistors 325 and 335 on top of the switching transistors 320 and 330 also reduces the voltage variation over the switching transistors 320 and 330, and therefore reduces the AM to PM conversion.

In the power amplifier 300 shown in FIG. 3A, the switching transistors 320 and 330 are of a size sufficient to maintain the performance of the power amplifier 300 for maximum output power. However, in low power operation, the LO leakage through the $C_{GD}$ capacitor is comparable or even higher than the output RF signal. As a result, the leakage covers the RF signal at the output, and therefore, it limits the power control dynamic range. The leakage signal may also limit the linearity of the amplitude modulation at low power operations.

Figure 4:
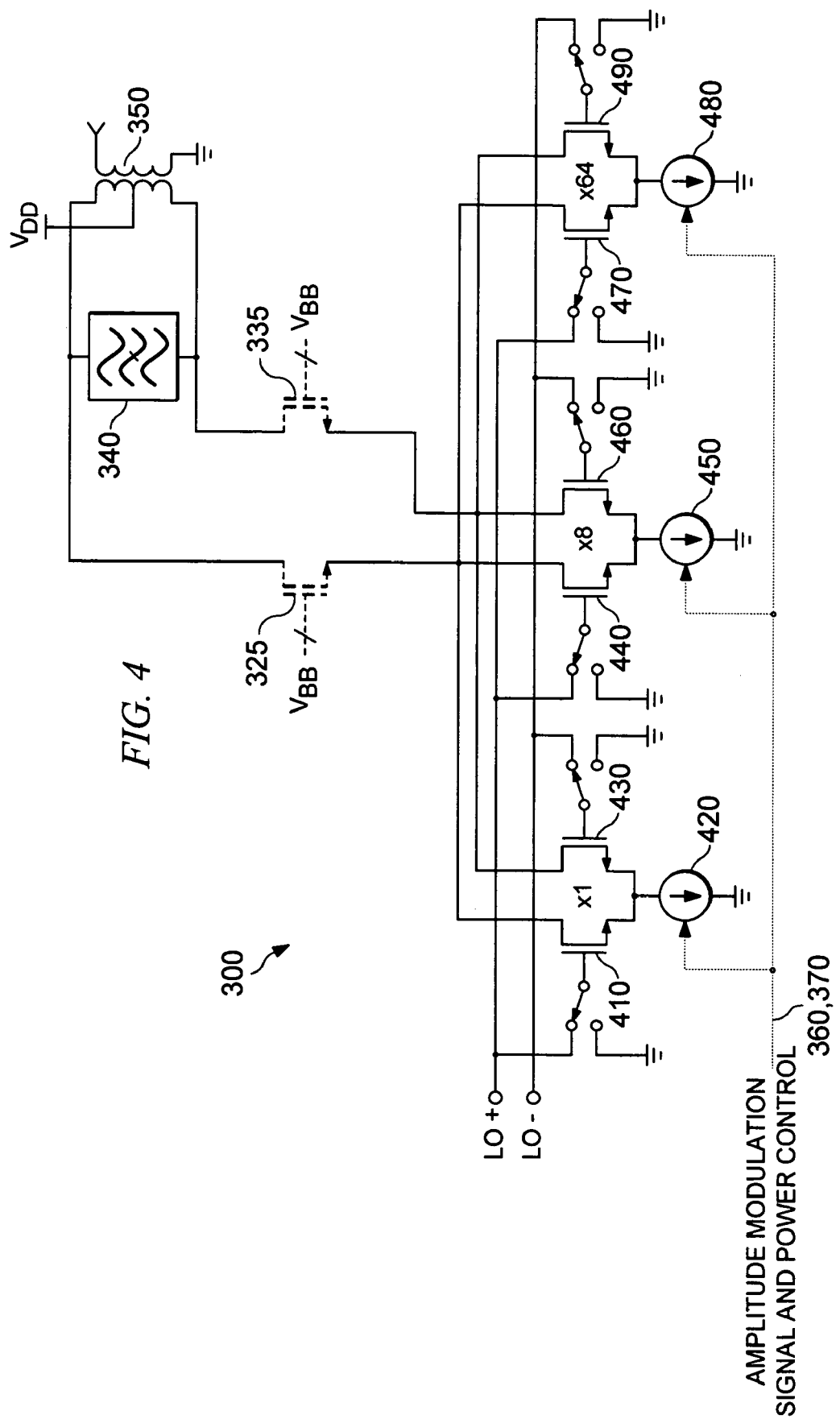
FIG. 4 is a schematic block diagram illustrating another exemplary DAC based switching power amplifier, in accordance with embodiments of the present invention.

FIG. 4 illustrates another exemplary DAC based switching power amplifier 300 architecture that overcomes the leakage problem at low power by decreasing the switch size for low power levels. In FIG. 4, the power amplifier 300 is divided to three stages with switch size ratios of ×1, ×8 and ×64. Each stage includes a switch pair and a corresponding tail current source. For example, stage ×1 includes switching transistors 410 and 430 and current source 420, stage ×8 includes switching transistors 440 and 460 and current source 450 and stage ×64 includes switching transistors 470 and 490 and current source 480. Each current source 420, 450 and 480 is operably coupled to receive the amplitude-modulated signal and the power control bits to control current through its respective switch pair (e.g., current source 420 controls current through switch pair 410 and 430, current source 450 controls current through switch pair 440 and 460 and current source 480 controls current through switch pair 470 and 490).

Each stage is associated with a different power level to minimize leakage at low power levels. For example, in FIG. 4, the switch size in each stage is eight times bigger than the previous stage. Thus, the maximum possible output power without leakage in each stage is 18 dB higher than the previous stage. However, the switch size of each stage is variable and depends on the particular application.

In one embodiment, switches connected to each switch pair select one or more of the stages to generate the appropriate output power for the power amplifier 300. In another embodiment, the stage selection can be made using the most significant bits (MSBs) of the power control word to turn on the appropriate stages. The remaining least significant bits (LSBs) can be used to control the tail current.

In an exemplary operation, the total power control range is divided into smaller ranges, with one of the switch pairs covering each range. To produce a particular output power, the stage corresponding to the range containing the desired output power is selected. To improve accuracy, each stage may have overlap with the following and previous stages. Turning off the large stages improves the linearity of the power amplifier 300 in low power operation. In addition, as in FIG. 3A, optional cascode transistors 325 and 335 may be used on top of the switching transistors 410, 430, 440, 460, 470 and 490 to reduce the voltage variation over the switching transistors.

Figure 5:
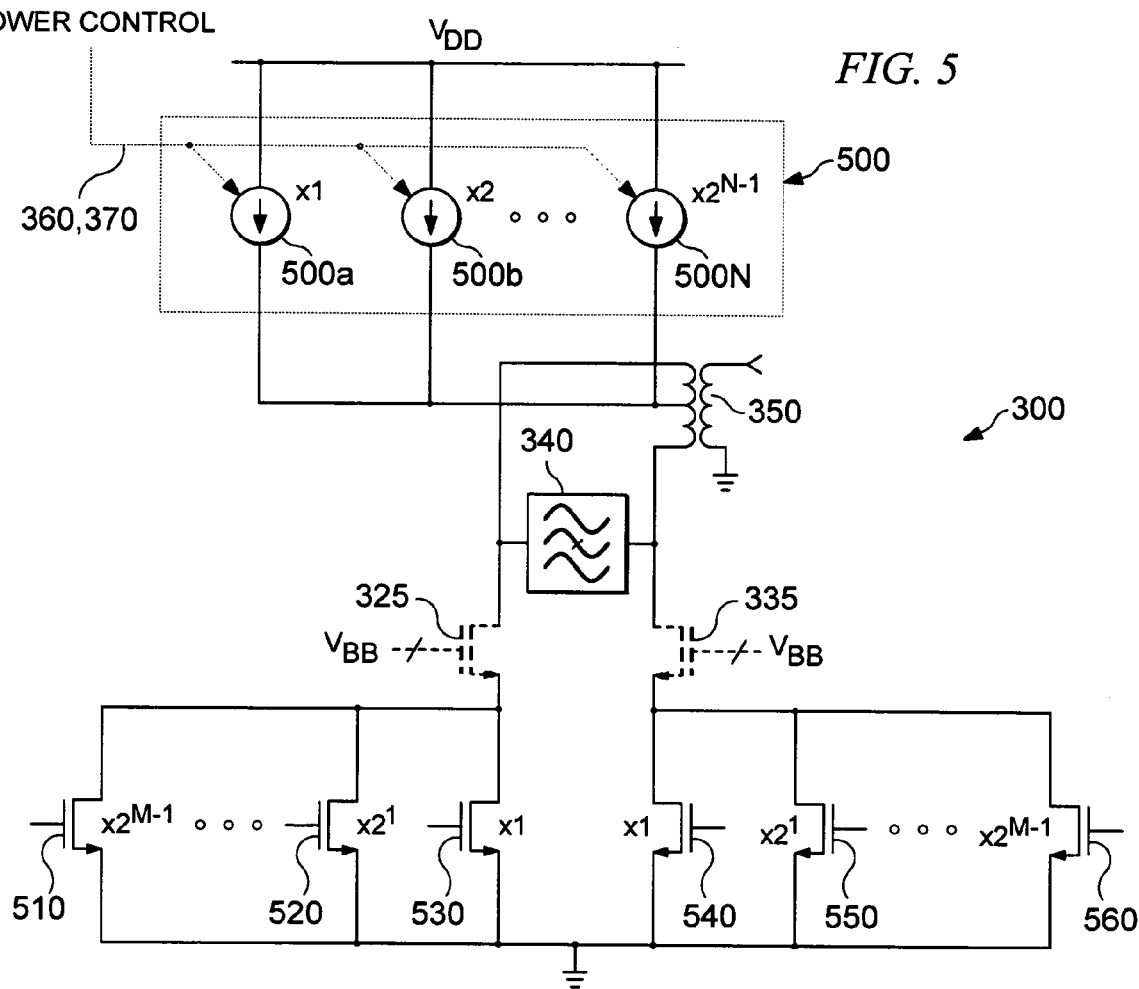
FIG. 5 is a schematic block diagram illustrating yet another exemplary DAC based switching power amplifier, in accordance with embodiments of the present invention.

FIG. 5 illustrates another exemplary DAC based switching power amplifier 300 architecture that overcomes the leakage problem by decreasing the switch size for low power levels. In FIG. 5, the power amplifier 300 is again divided into stages with switch size ratios of ×1, ×2$^1$ . . . ×2$^{M-1}$, in which each stage includes a switch pair. For example, stage ×1 includes switching transistors 530 and 540, stage ×2$^1$ includes switching transistors 520 and 550 and stage ×2$^{M-1}$ includes switching transistors 510 and 560. However, instead of including an individual current source in each stage as in FIG. 4, in FIG. 5, the current source 500 is placed on top to source the current through the center tab of the balun 350. In FIG. 5, the current source 500 includes a plurality of current sources 500a, 500b . . . 500N operably coupled in parallel to generate a current proportional to the amplitude-modulated signal 370 and the power control bits 360. This architecture avoids the body effect of the switching transistors.

The operation of the power amplifier 300 shown in FIG. 5 is similar to the operation described above with reference to the power amplifier 300 architecture shown in FIG. 4, in that one or more of the switch pairs (stages) are selected depending upon the desired output power. In addition, similar to FIG. 4, optional cascode transistors 325 and 335 may be used on top of the switching transistors 510, 520, 530, 540, 550 and 560 to reduce the voltage variation over the switching transistors.

Figure 6:
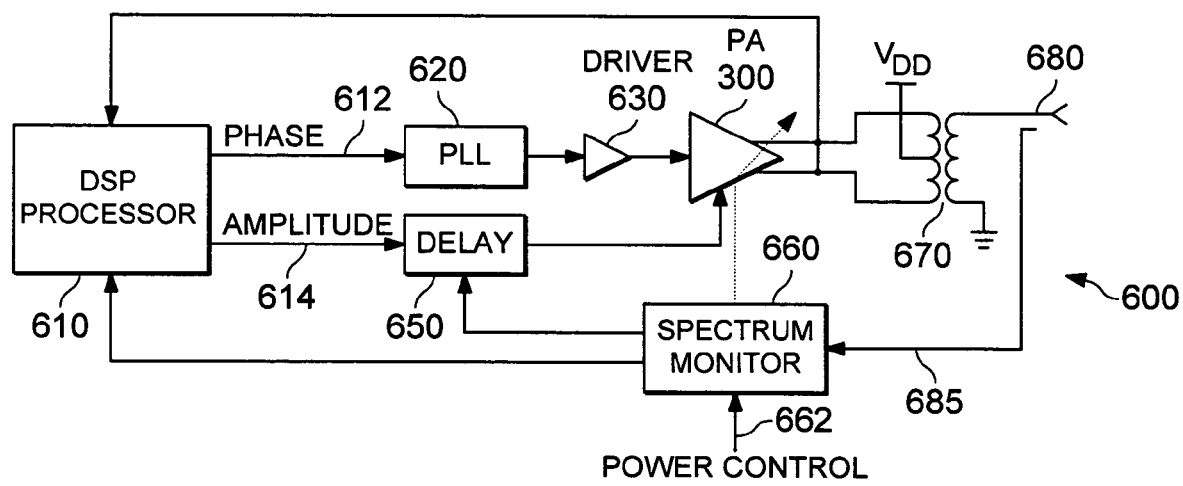
FIG. 6 is a schematic block diagram illustrating a polar transmitter having a DAC based switching power amplifier, in accordance with embodiments of the present invention.

FIG. 6 is a schematic block diagram illustrating a polar transmitter 600 having a DAC based switching power amplifier, in accordance with embodiments of the present invention. The polar transmitter 600 includes a DSP processor 610 (which can correspond to, for example, the modulator 130 in FIG. 1), a phase-locked loop 620, a driver 630, a delay 650 and the DAC based switching power amplifier 300 of the present invention. The DSP processor 610 performs the necessary pulse shaping, modulation, and interpolation filtering to produce a phase-modulated signal 612 and an amplitude-modulated signal 614, each at some intermediate frequency (IF) carrier $f_{IF}$. Although not shown, the polar transmitter 600 further includes digital-to-analog converters (DACs) that convert the IF phase-modulated signal 612 and IF amplitude-modulated signal 614 from digital to analog.

The IF analog phase-modulated signal 612 is input to the PLL 620, which translates, or up-converts, the IF signal to the desired RF signal, and applies the RF signal to the DAC based switching power amplifier 300 via the driver 630. With proper PLL 620 design, the phase of the RF output signal tracks the phase of the IF signal, as desired. The RF output signal is modulated in the DAC based switching power amplifier 300 by the analog amplitude-modulated signal 614 output from delay 650. For example, in an exemplary operation, the phase-modulated signal 612 is applied to the switches in the DAC based power amplifier 300, while the amplitude-modulated signal 614 is applied to the reference current of the tail current source (DAC module) in the DAC based power amplifier. The DSP processor 610 compares the output of the PA 300 to a desired output, and corrects for any possible distortion in the phase and/or amplitude paths.

In order to align the phase and amplitude information, the polar transmitter 600 further includes a spectrum monitor 660 operably coupled in a feedback loop to monitor the output spectrum 685 and adjust the delay 650 in the amplitude information path accordingly. In another embodiment, the spectrum monitor 660 may monitor the output spectrum 685 in the time domain by down-converting the output spectrum 685. Thus, the spectrum monitor 685 includes a first output coupled to the delay 650 for providing any delay adjustments and a second output coupled to the DSP processor 610 for providing the monitored output spectrum and any delay adjustments made to delay 650. The spectrum monitor 660 further receives a power control signal 662 that it provides to the delay 650 for transmission with the amplitude-modulated signal to the power amplifier 300 to control the output power of the transmitter 600. The modulated RF signal output from the DAC based switching PA 300 is transmitted over the antenna 680 via inductive load 670.

Figure 7:
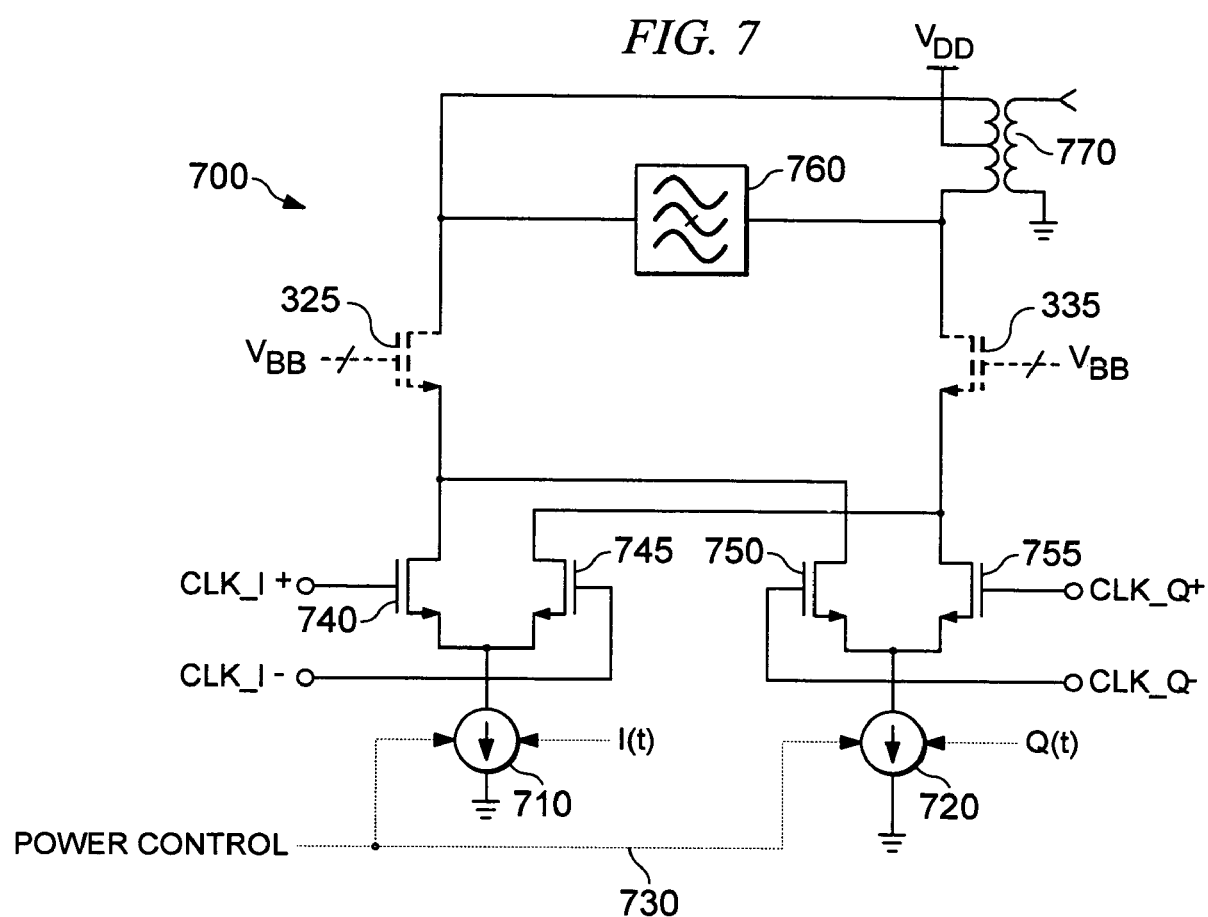
FIG. 7 is a schematic block diagram illustrating an I/Q transmitter having a DAC based switching power amplifier, in accordance with embodiments of the present invention.

FIG. 7 is a schematic block diagram illustrating an I/Q transmitter having a DAC based switching power amplifier 700, in accordance with embodiments of the present invention. The I/Q transmitter of FIG. 7 may be used, for example, in a constant envelope communication scheme in which the phase constitutes all of the information bearing part of the transmitted signal. In FIG. 7, the DAC based switching power amplifier 700 includes two power amplifiers, an I power amplifier and a Q power amplifier. In-phase (I) and quadrature-phase (Q) analog signals are applied to the I and Q power amplifiers, and the output currents are combined to produce the output of the power amplifier 700.

More particularly, the I power amplifier includes switching transistors 740 and 745 and current source 710, while the Q power amplifier includes switching transistors 750 and 755 and current source 720. The analog in-phase signal serves as the reference current for current source 710, while the analog quadrature-phase signal serves as the reference current for current source 720. Power control bits 730 are applied to the digital input of current source 710 to generate an in-phase bias current proportional to the in-phase signal and the power control bits 730. The in-phase bias current is then up-converted to the RF frequency via switching transistors 740 and 745. In addition, power control bits 730 are also applied to the digital input of current source 720 to generate a quadrature-phase bias current proportional to the quadrature-phase signal and the-power control bits 730. The quadrature-phase bias current is then up-converted to the RF frequency via switching transistors 750 and 755. The differential outputs of the I power amplifier and the Q power amplifier are combined and passed to the balun 760 via filter 760.

By using a DAC based switching power amplifier in an I/Q transmitter, the frequency synthesizer can be relaxed. In addition, the required modulation bandwidth of each power amplifier (I and Q) is less than the bandwidth required in polar transmitters. Furthermore, as in FIGS. 3A, 4 and 5, optional cascode transistors 325 and 335 may be used on top of the switching transistors 740, 745, 750 and 755 to reduce the voltage variation over the switching transistors.

Figure 8:
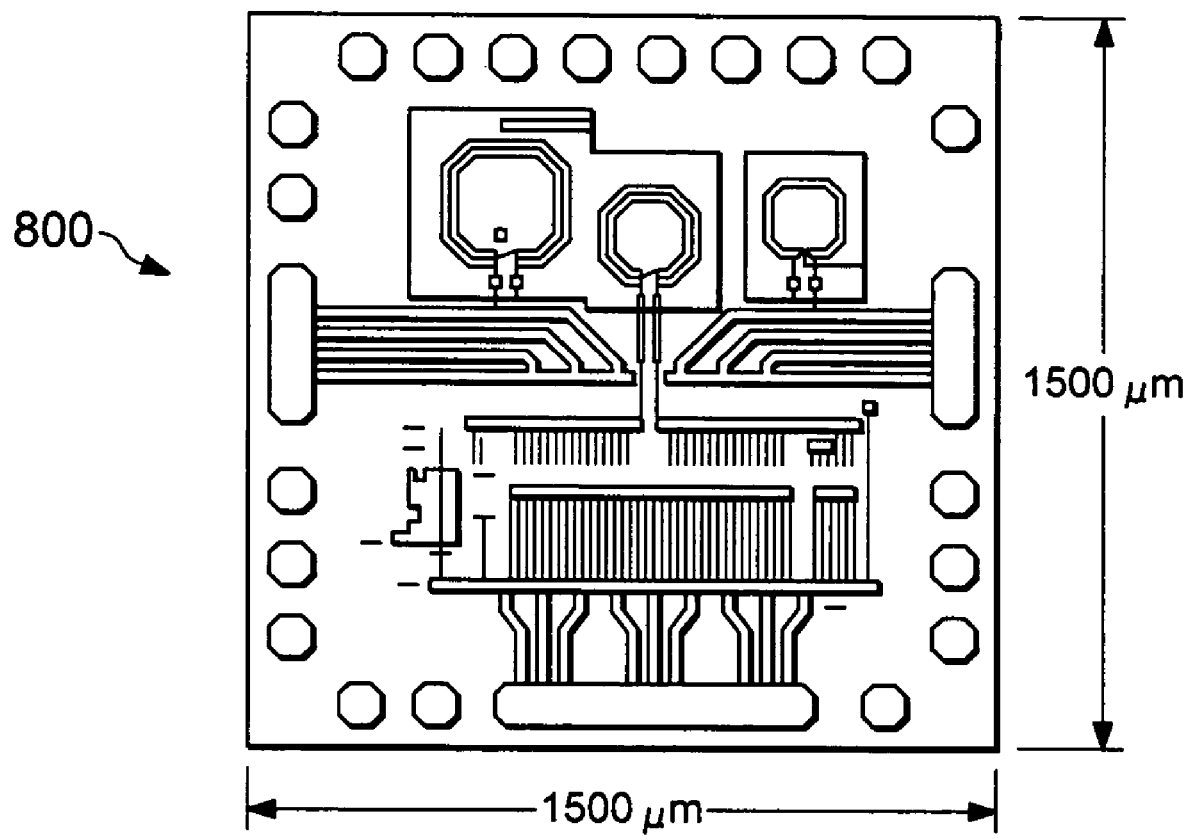
FIG. 8 illustrates an exemplary die cut of the DAC based switching power amplifier, in accordance with embodiments of the present invention.

FIG. 8 illustrates an exemplary die cut 800 of the DAC based switching power amplifier, in accordance with embodiments of the present invention. The DAC based switching power amplifier shown in FIG. 8 can be fabricated using, for example, a TSMC CMOS 0.18 μm process. In FIG. 8, the power amplifier occupies an area of 1.5×1.5 mm². The power amplifier is operating at 900 MHz and using a 3.3V supply voltage. Table 1 below illustrates a summary of exemplary measurement results of the fabricated power amplifier shown in FIG. 8.

TABLE 1

| | |
|---|---|
| Operational frequency | 900 MHz |
| Maximum output power | 27.8 dBm |
| Power efficiency @ Pout = 27.8 dBm | 34% |
| Power control dynamic range | >62 dB |
| Amplitude Modulation BW | ≧4.2 MHz |
| Amp. Mod. P − 1 dB, output @ Pout = 26 dBm | −12.6 dBc |
| Amp. Mod. OIP3 @ Pout = 26 dBm | −1 dBc |
| AM to PM @ Pout = 27.8 dBm | <0.5 degree/dB |

Figure 9:
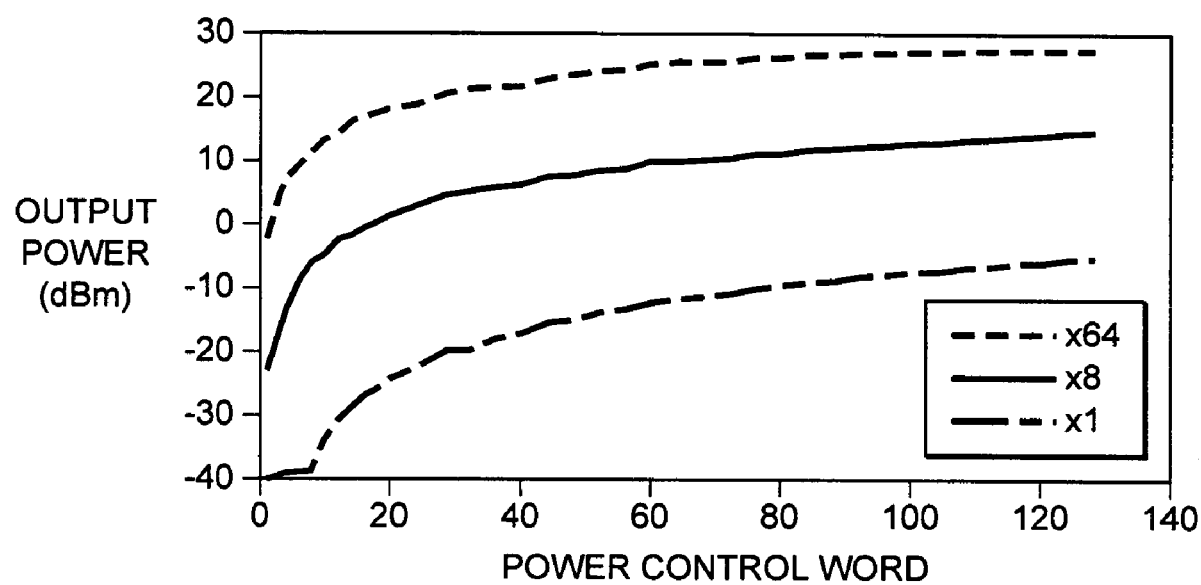
FIG. 9 is a chart illustrating exemplary measured output powers of the DAC based switching power amplifier for different power control words, in accordance with embodiments of the present invention.

FIG. 9 illustrates the output power of the DAC based power amplifier of the present invention versus a 7-bit power control word varying from 1 to 127 for three step switch sizes. As can be seen in FIG. 9, the DAC based power amplifier of the present invention achieved 62 dB power control dynamic range with maximum output power of 27.8 dBm.

Figure 10:
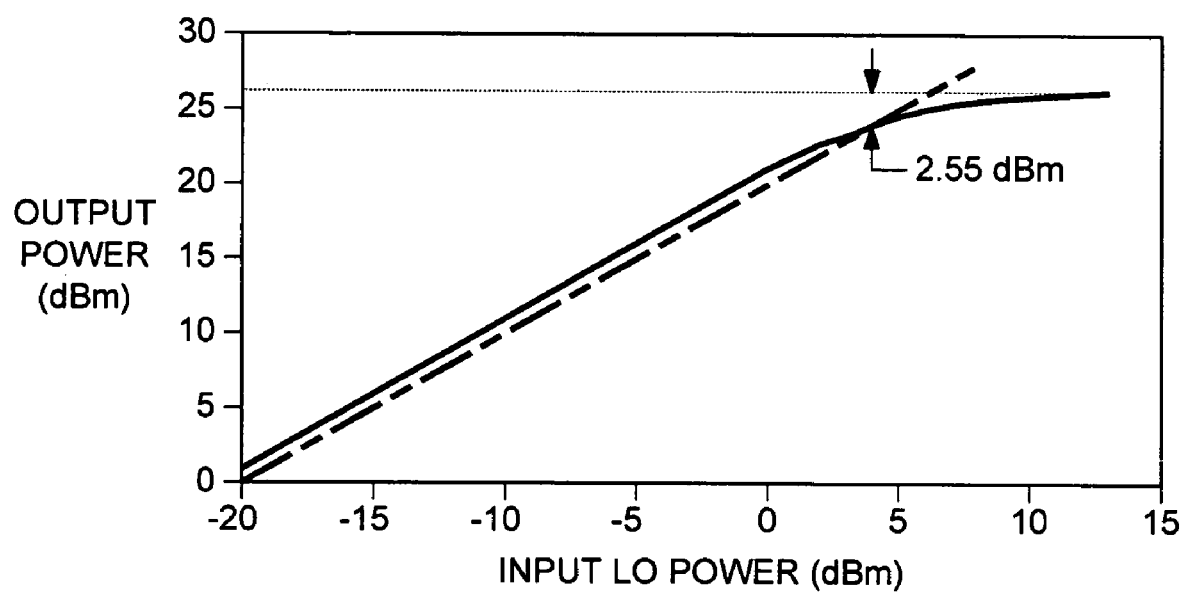
FIG. 10 is a chart illustrating exemplary measured output powers of the DAC based switching power amplifier for different powers of a local oscillation (LO) signal, in accordance with embodiments of the present invention.

Referring now to FIG. 10, the output power versus the LO input power of the DAC based switching power amplifier of the present invention is shown. For a low power LO signal, the power amplifier acts as a linear power amplifier whose maximum output power is limited to the −1 dB compression point of the curve shown in FIG. 10. Where the output power curve saturates, the power amplifier operates at the maximum output power. Therefore, the DAC based switching power amplifier is capable of delivering 2.5 dB more power than a linear power amplifier with the same bias current. In addition, in the DAC based switching power amplifier of the present invention, the bias current is proportional to the output signal level, and can be reduced by reducing the output amplitude, which improves the power efficiency of the power amplifier.

Figure 11:
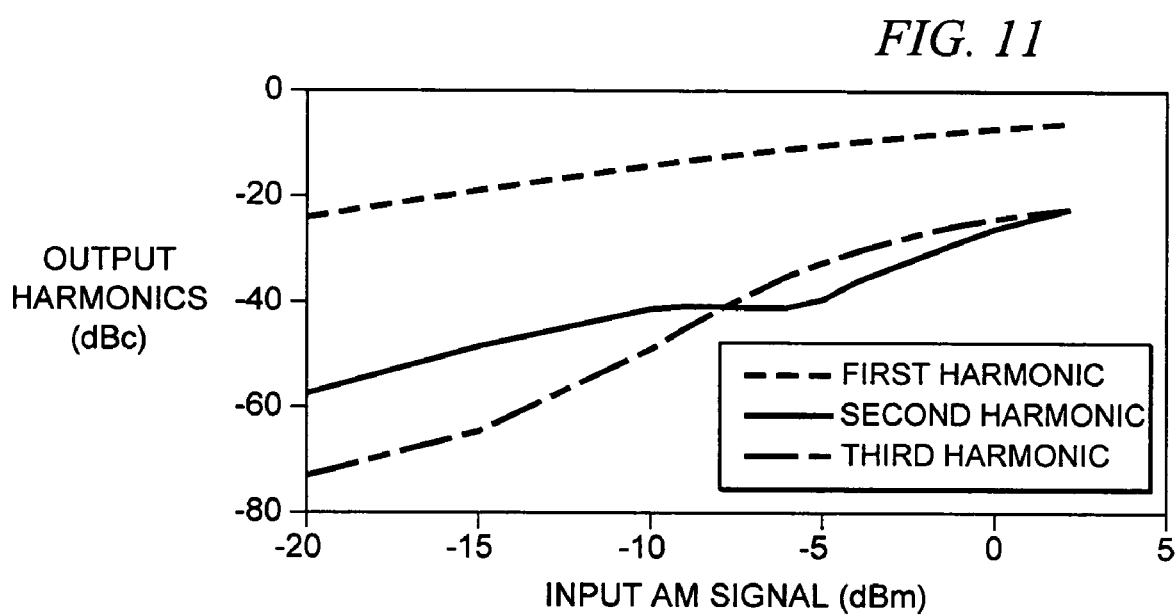
FIG. 11 is a chart illustrating exemplary measured single tone test results of the amplitude modulation of the DAC based switching power amplifier, in accordance with embodiments of the present invention.
Figure 12:
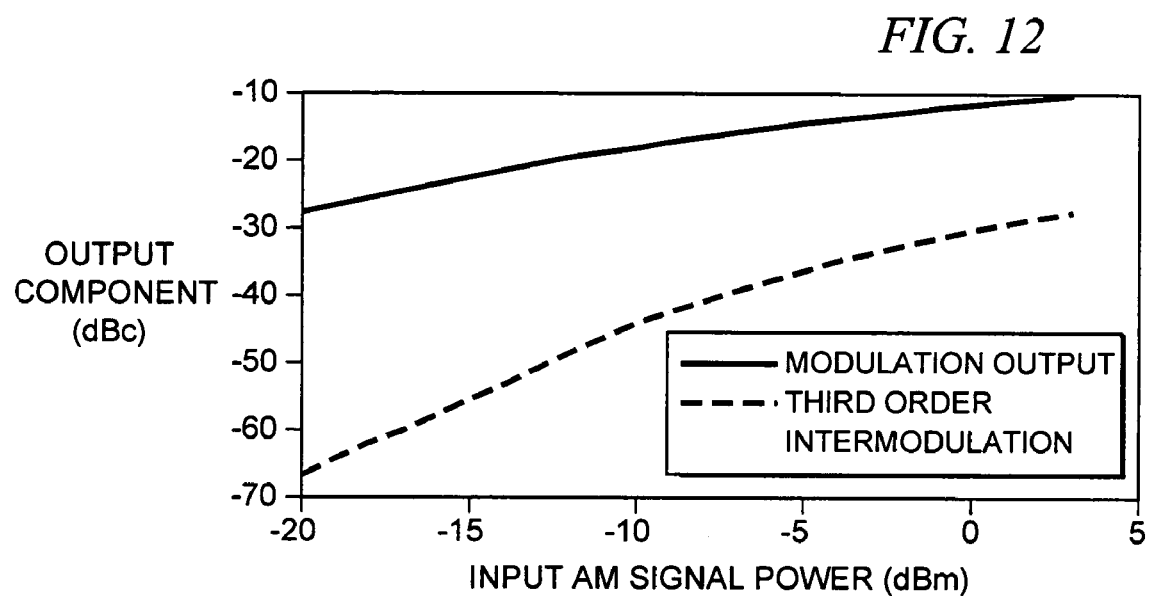
FIG. 12 is a chart illustrating exemplary measured two tone test results of the amplitude modulation of the DAC based switching power amplifier, in accordance with embodiments of the present invention.

Referring now FIGS. 11 and 12, the linearity of the amplitude modulation of the DAC based switching power amplifier of the present invention is shown using a single tone test and a two tone test. The single tone test result at Pout=26 dBm is shown in FIG. 11 for a tone signal with f=2 MHz applied to the amplitude modulation path. In FIG. 11, the amplitude modulation reaches its −1 dB compression point where the modulated signal at the output is 12.6 dB below the carrier. Moreover, for an input AM signal power of 2 dBm, the modulation output almost reaches −6 dBc, at which point the output envelope reaches its highest possible swing from zero to the maximum output amplitude. The two tone test is performed by applying two tone with f1=1.9 MHz and f2=2.1 MHz to the amplitude modulation path. FIG. 12 shows the two tone test results for Pout=26 dBm. The power amplifier exhibits the OIP3 of −1 dBc. Thus, the linearity of the amplitude modulation is a function of the output power.

Figure 13:
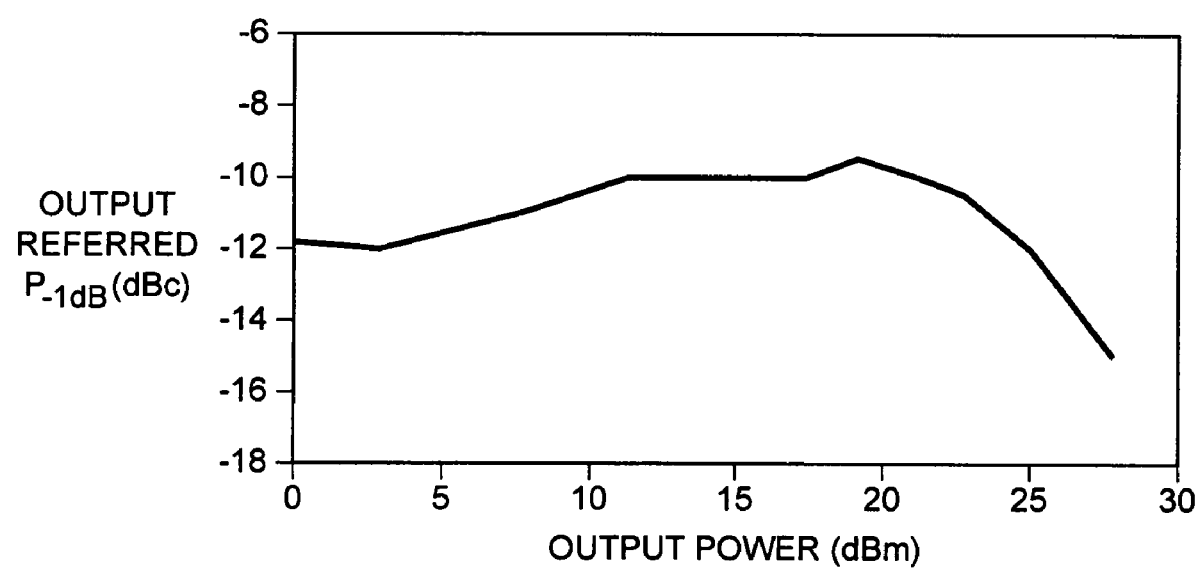
FIG. 13 is a chart illustrating exemplary measured output referred −1 dB compression point of the amplitude modulation for different output power levels, in accordance with embodiments of the present invention.
Figure 14:
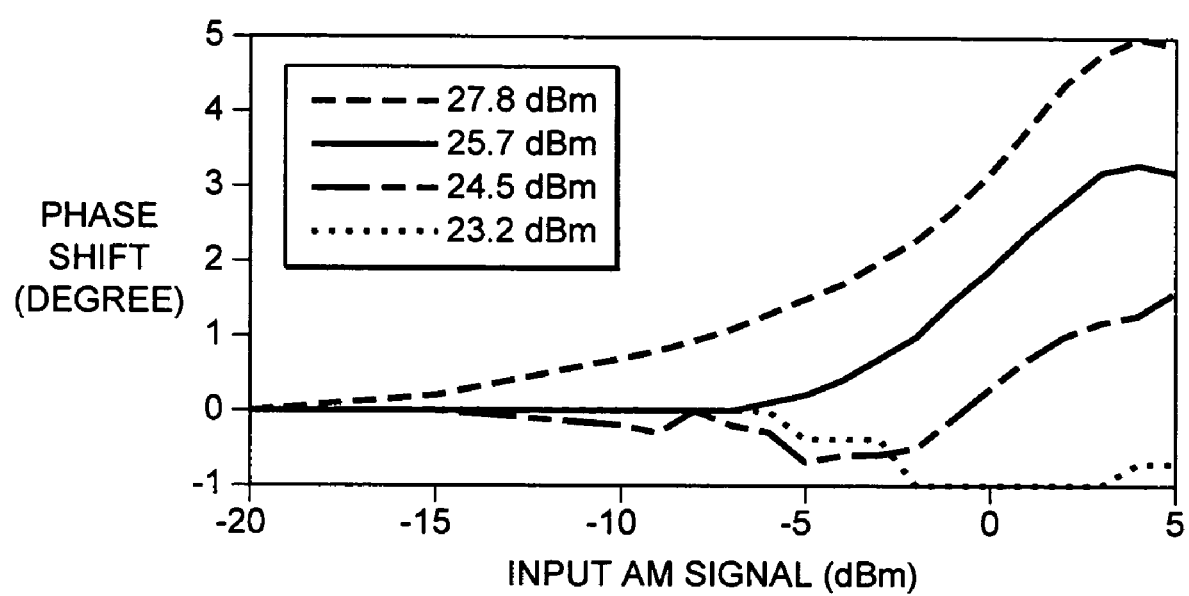
FIG. 14 is a chart illustrating exemplary measured amplitude modulation to phase modulation conversion for different output power levels, in accordance with embodiments of the present invention.

FIG. 13 shows the output referred −1 dB compression point of the amplitude modulation for different output power levels. The measured amplitude modulation bandwidth is 4.2 MHz for the maximum output power, which is sufficient for many applications. However, the amplitude modulation has higher bandwidth for lower levels of output power. The AM to PM conversion shown in FIG. 14 is derived by measuring the carrier phase shift for different power levels of a 2 MHz tone applied to the amplitude modulation input path. Thus, as can be seen from FIGS. 9-14, the measurement results of the DAC based switching power amplifier of the present invention show substantial improvement in the amplitude modulation capability as well as the power control dynamic range compared to existing non-linear power amplifiers used in polar transmitters.

FIG. 15 is a logic diagram of a method 900 for producing an amplified modulated RF signal, in accordance with embodiments of the present invention. The method begins at step 910, where a power amplifier is provided with a differential switch pair and a digital to analog conversion module operably coupled to the differential switch pair. The method then proceeds to steps 920 and 930, where a phase-modulated RF signal is received at an input of the differential switch pair and an amplitude-modulated signal at the digital to analog conversion module. At step 940, a bias current for biasing the differential switch pair is generated by the digital to analog conversion module. The bias current is proportional to the amplitude-modulated signal. Finally, at step 950, an amplified modulated RF signal is produced at an output of the differential switch pair in response to the phase-modulated RF signal and the bias current. The outbound modulated RF signal has an amplitude proportional to the amplitude-modulated signal.

As one of ordinary skill in the art will appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "operably coupled".

The preceding discussion has presented a DAC based switching power amplifier and method of operation thereof. As one of ordinary skill in the art will appreciate, other embodiments may be derived from the teaching of the present invention without deviating from the scope of the claims.

What is claimed is:

1. A power amplifier for use in a transmitter, comprising:
   a first transistor having an input, a first node and a second node, wherein the input of the first transistor is operably coupled to receive a first input;
   a second transistor having an input, a first node, and a second node, wherein the input of the second transistor is operably coupled to receive a second input; and
   a digital to analog conversion module operably coupled to control current through the first and second transistors based on at least one of a power control signal and an amplitude modulation control signal, wherein outputs of the second nodes of the first and second transistors provide an output of the power amplifier.

2. The power amplifier of claim 1, wherein the digital to analog conversion module controls current through the first and second input transistors based on the power control signal and an in-phase modulated signal, and further comprising:
   a third transistor having an input, a first node and a second node, wherein the input of the third transistor is operably coupled to receive a third input;
   a fourth transistor having an input, a first node, and a second node, wherein the input of the fourth transistor is operably coupled to receive a fourth input; and
   an additional digital to analog conversion module operably coupled to control current through the third and fourth transistors based on the power control signal and a quadrature-phase modulated signal, wherein outputs of the second nodes of the third and fourth transistors are combined with outputs of the second nodes of the first and second transistors to provide the output of the power amplifier.

3. The power amplifier of claim 1, wherein the first and second inputs are phase modulated signals.

4. The power amplifier of claim 1, wherein the amplitude modulation control signal is a reference current applied to the digital to analog conversion module and the power control signal is a digital signal applied to a digital input of the digital to analog conversion module.

5. The power amplifier of claim 1, wherein the amplitude modulation control signal is a digital signal applied to a digital input of the digital to analog conversion module and an analog reference current is applied to the digital to analog conversion module to control the output power of the power amplifier.

6. The power amplifier of claim 1, wherein the digital to analog conversion module includes multiple current sources operably coupled in parallel and operably coupled to the first nodes of the first and second transistors.

7. The power amplifier of claim 1, wherein the digital to analog conversion module is operably coupled to the first nodes of the first and second transistors, and wherein the first transistor in combination with the second transistor forms a first switch pair having a first power range, and further comprising:
   a second switch pair having a second power range less than the first power range and operably coupled to provide the output of the power amplifier;
   a second digital to analog conversion module operably coupled to the second switch pair to control current through the second switch pair based on at least one of the power control signal and the amplitude modulation control signal; and
   a switch operably coupled to select at least one of the first switch pair and the second switch pair to produce the output of the power amplifier.

8. The power amplifier of claim 7, wherein each of the digital to analog conversion module and the second digital to analog conversion module include a respective current source.

9. The power amplifier of claim 1, further comprising:
   an inductive load operably coupled to the second nodes of the first and second transistors.

10. The power amplifier of claim 9, further comprising:
    a filter operably coupled between the second nodes of the first and second transistors and operably coupled between the inductive load and the second nodes of the first and second transistors.

11. The power amplifier of claim 10, wherein the first transistor is a first switching transistor and the second transistor is a second switching transistor, and further comprising:

a first cascode transistor operably coupled between the filter and the second node of the first switching transistor; and a second cascode transistor operably coupled between the filter and the second node of the second switching transistor.

12. The power amplifier of claim 9, wherein the inductive load is a balun.

13. The power amplifier of claim 12, wherein the digital to analog conversion module controls the current through the first and second transistors by sourcing current through a center tab of the balun.

14. The power amplifier of claim 13, wherein the first transistor and the second transistor form a first switch pair having a first power range, and further comprising:

a second switch pair having a second power range less than the first power range and operably coupled to the balun to provide the output of the power amplifier; and a switch operably coupled to select one of the first switch pair and the second switch pair to produce the output of the power amplifier.

15. A polar transmitter, comprising:

a modulator operably coupled to receive an outgoing digital signal and operable to digitally modulate the outgoing digital signal to produce a phase-modulated digital signal and an amplitude-modulated digital signal;

first and second Digital-to-Analog converters (DACs) for converting the phase-modulated digital signal and the amplitude-modulated digital signal, respectively, from digital signals to analog signals to produce a phase-modulated analog signal and an amplitude-modulated analog signal;

a phase locked loop operably coupled to receive the phase-modulated analog signal and to up-convert the phase-modulated analog signal from an IF frequency to an RF frequency to produce a phase-modulated RF signal; and a power amplifier for producing a modulated RF signal based on the phase-modulated RF signal and the amplitude-modulated analog signal, wherein the power amplifier further includes:

a first transistor having an input, a first node and a second node, wherein the input of the first transistor is operably coupled to receive a first input, a second transistor having an input, a first node, and a second node, wherein the input of the second transistor is operably coupled to receive a second input, and a digital to analog conversion module operably coupled to control current through the first and second transistors based on at least a power control signal and the amplitude-modulated analog signal, wherein outputs of the second nodes of the first and second transistors provide an output of the power amplifier.

16. The transmitter of claim 15, wherein the first and second inputs correspond to the phase-modulated analog signal.

17. The transmitter of claim 16, further comprising:

a delay operably coupled to receive the amplitude-modulated analog signal and to provide a delayed amplitude-modulated analog signal to the power amplifier.

18. The transmitter of claim 17, further comprising:

a feed-back loop operably coupled to monitor an output of the power amplifier and to adjust the delay based on the output of the power amplifier.

19. A method for producing an amplified modulated radio frequency (RF) signal, comprising:

providing a differential switch pair and a digital to analog conversion module operably coupled to the differential switch pair;

receiving a phase-modulated RF signal at an input of the differential switch pair;

receiving an amplitude-modulated signal at the digital to analog conversion module;

generating a bias current for biasing the differential switch pair by the digital to analog conversion module, the bias current being proportional to the amplitude-modulated signal; and producing the amplified modulated RF signal at an output of the differential switch pair in response to the phase-modulated RF signal and the bias current, the outbound modulated RF signal having an amplitude proportional to the amplitude-modulated signal.

20. The method of claim 19, wherein the amplitude-modulated signal is a reference current, and wherein said receiving the amplitude-modulated signal at the digital to analog conversion module further comprises:

applying the reference current to the digital to analog conversion module; and applying a digital power control signal to a digital input of the digital to analog conversion module.

21. The method of claim 19, wherein the amplitude modulation control signal is a digital signal, and wherein said receiving the amplitude-modulated signal at the digital to analog conversion module further comprises:

applying the digital signal to a digital input of the digital to analog conversion module; and applying an analog reference current to the digital to analog conversion module to control the power of the amplified modulated RF signal.

* * * * *